US012765302B2

(12) United States Patent
Takatoh et al.

(10) Patent No.: US 12,765,302 B2
(45) Date of Patent: Oct. 13, 2026

(54) SUBSTRATE CLEANING APPARATUS AND SUBSTRATE CLEANING METHOD

(71) Applicant: Ebara Corporation, Tokyo (JP)

(72) Inventors: Chikako Takatoh, Tokyo (JP); Akira Fukunaga, Tokyo (JP); Masamitsu Kurashita, Tokyo (JP); Megumi Uno, Tokyo (JP); Satomi Hamada, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 92 days.

(21) Appl. No.: 19/014,595

(22) Filed: Jan. 9, 2025

(65) Prior Publication Data

US 2025/0144675 A1 May 8, 2025

Related U.S. Application Data

(63) Continuation of application No. 16/979,715, filed as application No. PCT/JP2019/005827 on Feb. 18, 2019, now abandoned.

(30) Foreign Application Priority Data

Mar. 15, 2018 (JP) ................................ 2018-048217

(51) Int. Cl.
*H10P 70/00* (2026.01)
*B08B 1/14* (2024.01)
(Continued)

(52) U.S. Cl.
CPC ............ *H10P 72/0412* (2026.01); *B08B 1/14* (2024.01); *B08B 1/34* (2024.01); *B08B 1/36* (2024.01);
(Continued)

(58) Field of Classification Search
CPC .. H10P 72/0412; H10P 72/0414; H10P 70/60; H10P 72/0406; H10P 70/20;
(Continued)

(56) References Cited

U.S. PATENT DOCUMENTS 5,860,181 A 1/1999 Maekawa et al.
2001/0009157 A1 7/2001 Maekawa et al.
(Continued)

FOREIGN PATENT DOCUMENTS

CN 105895556 A 8/2016
JP H09-092633 A 4/1997
(Continued)

OTHER PUBLICATIONS

Japan Patent Office, International Search Report in International Application No. PCT/JP2019/005827 (Apr. 23, 2019).

*Primary Examiner* — Kaj K Olsen
*Assistant Examiner* — Ryan L Coleman
(74) *Attorney, Agent, or Firm* — Leydig, Voit & Mayer, Ltd.

(57) ABSTRACT

There is provided a substrate cleaning apparatus capable of highly effective self-cleaning of a cleaning tool in a short time period. The substrate cleaning apparatus includes a cleaning tool for cleaning a substrate while in contact with a surface of the substrate, a self-cleaning member for self-cleaning the cleaning tool while in contact with the cleaning tool, a rotation mechanism for rotating the cleaning tool, and a holding mechanism for holding the cleaning tool, the holding mechanism being capable of pressing the cleaning tool against the substrate and pressing the cleaning tool against the self-cleaning member. The substrate cleaning apparatus also includes a controller which controls pressing force for the cleaning tool against the self-cleaning member such that self-cleaning torque, with which the rotation
(Continued)

mechanism rotates the cleaning tool at the time of self-cleaning of the cleaning tool, is prescribed torque equal to or more than substrate cleaning torque, with which the rotation mechanism rotates the cleaning tool when the cleaning tool cleans the substrate.

7 Claims, 7 Drawing Sheets

(51) Int. Cl.

| | |
|---|---|
| ***B08B 1/34*** | (2024.01) |
| ***B08B 1/36*** | (2024.01) |
| ***B08B 1/54*** | (2024.01) |
| ***B08B 3/12*** | (2006.01) |
| ***H10P 52/00*** | (2026.01) |
| ***H10P 72/00*** | (2026.01) |

(52) U.S. Cl.
CPC .................. *B08B 1/54* (2024.01); *B08B 3/12* (2013.01); *H10P 52/00* (2026.01); *H10P 70/00* (2026.01)

(58) Field of Classification Search
CPC ...... H10P 70/237; H10P 70/234; H10P 70/10; B08B 1/52; B08B 1/36; B08B 1/54; B08B 1/34; B08B 1/14; B24B 53/017
See application file for complete search history.

(56) References Cited

U.S. PATENT DOCUMENTS

| | | | |
|---|---|---|---|
| 2007/0221249 | A1 | 9/2007 | Sugarman et al. |
| 2008/0289652 | A1 | 11/2008 | Hamada |
| 2015/0020851 | A1 | 1/2015 | Sakurai et al. |
| 2016/0243593 | A1 | 8/2016 | Tanaka |
| 2016/0254170 | A1 | 9/2016 | Hu et al. |
| 2017/0316960 | A1 | 11/2017 | Ishibashi |
| 2019/0006204 | A1 | 1/2019 | Wei et al. |
| 2020/0281347 | A1 | 9/2020 | Park et al. |

FOREIGN PATENT DOCUMENTS

| | | | |
|---|---|---|---|
| JP | H10-092781 | A | 4/1998 |
| JP | H10-109074 | A | 4/1998 |
| JP | 2003273058 | A | 9/2003 |
| JP | 2005-012238 | A | 1/2005 |
| JP | 2005-079216 | A | 3/2005 |
| JP | 2008-515171 | A | 5/2008 |
| JP | 2010-021457 | A | 1/2010 |
| JP | 2012-199407 | A | 10/2012 |
| JP | 2015-065379 | A | 4/2015 |
| KR | 20170043664 | | 4/2017 |

SUBSTRATE CLEANING APPARATUS AND SUBSTRATE CLEANING METHOD

CROSS-REFERENCE TO RELATED APPLICATIONS

This patent application is a continuation of U.S. patent application Ser. No. 16/979,715, filed on Sep. 10, 2024, which is a U.S. national phase of International Application No. PCT/JP2019/005827, filed Feb. 18, 2019, which claims the benefit of Japanese Patent Application No. 2018-048217, filed on Mar. 15, 2018, which are incorporated by reference in their entireties herein.

TECHNICAL FIELD

The present invention relates to a substrate cleaning apparatus and a substrate cleaning method.

BACKGROUND ART

In a manufacturing process of semiconductor devices, various types of films different in physical properties are formed on a silicon substrate, and the films are subjected to various types of processing, thereby forming fine metal wiring. For example, in a damascene wiring formation process, a wiring groove is formed in a film, and a metal, such as Cu, is embedded in the wiring groove. After that, excess metal is removed by chemical mechanical polishing (CMP), thereby forming metal wiring. Generally, a CMP apparatus (polishing apparatus) which polishes a substrate is equipped with a substrate cleaning apparatus which cleans a polished substrate. A substrate is cleaned by bringing a cleaning tool, such as a roll sponge or a pen sponge, into contact with the substrate while rotating the substrate.

As cleaning of a substrate with a cleaning tool proceeds, abrasive grains used in CMP and polishing debris (hereinafter also collectively referred to as "processing debris") are accumulated on a surface of and in the cleaning tool. In order to remove such processing debris from the cleaning tool, periodic self-cleaning of the cleaning tool is performed. The self-cleaning of the cleaning tool is performed by bringing the cleaning tool into contact with a self-cleaning member, such as a brush or a plate, while rotating the cleaning tool. Before cleaning a polished substrate with a new replacement brush, processing called a break-in similar to the self-cleaning is also performed for the purpose of initializing the brush. The processes will be collectively referred to as self-cleaning hereinafter.

The above-described self-cleaning of a cleaning tool is, for example, performed between substrates (each time one substrate is cleaned) in a relatively short time period and performed between lots (each time a prescribed number of substrates are cleaned) and at the time of break-in processing in a relatively long time period. Ultrapure water is often used as a cleaning liquid for substrate-to-substrate self-cleaning, and a chemical solution may be used as a cleaning liquid for lot-to-lot self-cleaning and at the time of break-in processing.

CITATION LIST

Patent Literature

PTL 1: Japanese Patent Laid-Open No. 2005-12238

SUMMARY OF INVENTION

Technical Problem

Since self-cleaning of a cleaning tool is executed during a substrate processing process or between substrate processing processes, when a time period taken for self-cleaning is longer, the overall time efficiency of substrate processing decreases. In contrast, when the self-cleaning effect for the cleaning tool is reduced by shortening a time period taken for self-cleaning, processing debris left at the cleaning tool contaminates a substrate.

It is conceivable to adjust a rotational speed of a cleaning tool, a temperature of a cleaning liquid, and the like in order to enhance the self-cleaning effect. That is, increase in the rotational speed of the cleaning tool is assumed to increase the frequency of contact at a portion of contact between the cleaning tool and a self-cleaning member and enhance the self-cleaning effect for the cleaning tool. Additionally, increase in the temperature of the cleaning liquid is assumed to make polishing debris more likely to be discharged into the cleaning liquid and enhance the self-cleaning effect for the cleaning tool.

The self-cleaning effect is affected by friction between the cleaning tool and the self-cleaning member. When the friction between the cleaning tool and the self-cleaning member is insufficient, processing debris is not discharged from the cleaning tool, and a full self-cleaning effect is not achieved. In contrast, excessive friction between the cleaning tool and the self-cleaning member can cause abrasion and deterioration of the cleaning tool. As a result of studies by the present inventor, it has found that a press and a rotational speed of a cleaning tool and a temperature of a cleaning liquid affect friction between the cleaning tool and a self-cleaning member in various manners.

An object of the present invention, which has been made in view of at least a part of the above-described problems, is to provide a substrate cleaning apparatus or a substrate cleaning method capable of highly effective self-cleaning of a cleaning tool in a short time period. Another object of the present invention is to provide a substrate cleaning apparatus or a substrate cleaning method capable of self-cleaning of cleaning tool by pressing the cleaning tool against a self-cleaning member with suitable pressing force.

Solution to Problem (Mode 1) According to mode 1, there is proposed a substrate cleaning apparatus. The substrate cleaning apparatus includes a cleaning tool for cleaning a substrate while in contact with a surface of the substrate, a self-cleaning member for self-cleaning the cleaning tool while in contact with the cleaning tool, a rotation mechanism for rotating the cleaning tool, a holding mechanism which holds the cleaning tool, the holding mechanism being capable of pressing the cleaning tool against the substrate and pressing the cleaning tool against the self-cleaning member, and a controller which controls pressing force for the cleaning tool against the self-cleaning member such that torque, with which the rotation mechanism rotates the cleaning tool when the cleaning tool is in contact with the self-cleaning member, is prescribed torque equal to or more than substrate cleaning torque, with which the rotation mechanism rotates the cleaning tool when the cleaning tool cleans the substrate. According to mode 1, it is possible to press the cleaning tool against the self-cleaning member with suitable pressing force and self-clean the cleaning tool.

(Mode 2) According to mode 2, there is proposed a substrate cleaning apparatus. The substrate cleaning apparatus includes a cleaning tool for cleaning a substrate while in contact with a surface of the substrate, a self-cleaning member for self-cleaning the cleaning tool while in contact with the cleaning tool, a rotation mechanism for rotating the cleaning tool, a holding mechanism which holds the cleaning tool, the holding mechanism being capable of pressing the cleaning tool against the substrate and pressing the cleaning tool against the self-cleaning member, and a controller which, when the cleaning tool is in contact with the self-cleaning member, controls the holding mechanism such that the cleaning tool is pressed against the self-cleaning member with first pressing force when the cleaning tool is rotating at a first rotational speed and controls the holding mechanism such that the cleaning tool is pressed against the self-cleaning member with second pressing force larger than the first pressing force when the cleaning tool is rotating at a second rotational speed higher than the first rotational speed. Mode 2 is based on the discovery that friction between the cleaning tool and the self-cleaning member tends to decrease with increase in a rotational speed of the cleaning tool. According to mode 2, it is possible to press the cleaning tool against the self-cleaning member with suitable pressing force and self-clean the cleaning tool.

(Mode 3) According to mode 3, there is proposed a substrate cleaning apparatus. The substrate cleaning apparatus includes a cleaning tool for cleaning a substrate while in contact with a surface of the substrate, a self-cleaning member for self-cleaning the cleaning tool while in contact with the cleaning tool, a rotation mechanism for rotating the cleaning tool, a holding mechanism which holds the cleaning tool, the holding mechanism being capable of pressing the cleaning tool against the substrate and pressing the cleaning tool against the self-cleaning member, and a controller which, when the cleaning tool is in contact with the self-cleaning member in liquid or with supply of the liquid, controls the holding mechanism such that the cleaning tool is pressed against the self-cleaning member with first pressing force when the liquid is at a first temperature and controls the holding mechanism such that the cleaning tool is pressed against the self-cleaning member with second pressing force larger than the first pressing force when the liquid is at a second temperature higher than the first temperature. Mode 3 is based on the discovery that friction between the cleaning tool and the self-cleaning member decreases with increase in a temperature of the liquid used for self-cleaning. According to mode 3, it is possible to press the cleaning tool against the self-cleaning member with suitable pressing force and self-clean the cleaning tool.

(Mode 4) According to mode 4, there is proposed a substrate cleaning apparatus. The substrate cleaning apparatus includes a cleaning tool for cleaning a substrate while in contact with a surface of the substrate, a first self-cleaning member for self-cleaning the cleaning tool while in contact with the cleaning tool, the first self-cleaning member being formed of a first material, and a second self-cleaning member for self-cleaning the cleaning tool while in contact with the cleaning tool, the second self-cleaning member being formed of a second material, and selects one of the first self-cleaning member and the second self-cleaning member on the basis of external input and self-cleans the cleaning tool by bringing the cleaning tool into contact with the selected self-cleaning member. According to mode 4, it is possible to select the self-cleaning member on the basis of the external input and self-clean the cleaning tool. This allows highly effective self-cleaning of the cleaning tool in a short time period.

(Mode 5) According to mode 5, there is proposed a substrate cleaning apparatus. The substrate cleaning apparatus includes a cleaning tool for cleaning a substrate while in contact with a surface of the substrate, a first self-cleaning member for self-cleaning the cleaning tool while in contact with the cleaning tool, the first self-cleaning member being formed of a first material, and a second self-cleaning member for self-cleaning the cleaning tool while in contact with the cleaning tool, the second self-cleaning member being formed of a second material, and self-cleans the cleaning tool by bringing the cleaning tool into contact with the first self-cleaning member and then bringing the cleaning tool into contact with the second self-cleaning member. According to mode 5, self-cleaning of the cleaning tool is performed using the two self-cleaning members. This allows enhancement of a self-cleaning effect for the cleaning tool.

(Mode 6) According to mode 6, in the substrate cleaning apparatus of mode 4 or 5, the first material is a material in which surface free energy has a larger hydrogen-bonding component and a smaller dispersion force component than the second material at the time of self-cleaning the cleaning tool. According to mode 6, it is possible to first remove processing debris, such as abrasive grains, in which surface free energy has a larger hydrogen-bonding component from the cleaning tool, using the first self-cleaning member and then remove processing debris, such as organic complexes, in which surface free energy has a larger dispersion force component from the cleaning tool, using the second self-cleaning member.

(Mode 7) According to mode 7, in the substrate cleaning apparatus of any one of modes 4 to 6, the first material is an inorganic oxide-based material or a first organic polymer-based material which has a polar group in a molecular structure, and the second material is a second organic polymer-based material which is non-polar.

(Mode 8) According to mode 8, in the substrate cleaning apparatus of any one of modes 1 to 7, the self-cleaning of the cleaning tool includes short-time self-cleaning of first duration and long-time self-cleaning of second duration longer than the first duration, and ultrapure water is used in the short-time self-cleaning, and a chemical solution may be used in the long-time self-cleaning, and ultrapure water-based rinse processing is subsequently performed when a chemical solution is used. In either case, a cleaning effect may be enhanced by increasing a liquid temperature. Note that, when rinsing using ultrapure water is performed after use of a chemical solution, cleaning torque may change before or after the rinsing. In the case, pressing or the number of revolutions is adjusted such that the cleaning torque is equal to or more than torque at the time of wafer cleaning.

(Mode 9) According to mode 9, the substrate cleaning apparatus of any one of modes 1 to 8 further includes a bath in which liquid is stored and which houses the self-cleaning member, and a vibration module which gives ultrasound vibration to the liquid.

(Mode 10) According to mode 10, the substrate cleaning apparatus of any one of modes 1 to 9 further includes a jetting module which jets gas or liquid toward the cleaning tool when the cleaning tool is self-cleaned.

(Mode 11) According to mode 11, there is proposed a substrate cleaning method. The substrate cleaning method includes a cleaning step of cleaning a substrate by rotating a cleaning tool and bringing the cleaning tool into contact with a surface of the substrate, and a self-cleaning step of self-cleaning the cleaning tool by rotating the cleaning tool and bringing the cleaning tool into contact with a self-cleaning member, and the self-cleaning step includes controlling pressing force for the cleaning tool against the self-cleaning member such that torque which rotates the cleaning tool is prescribed torque equal to or more than substrate cleaning torque which rotates the cleaning tool in the cleaning step. According to mode 11, it is possible to press the cleaning tool against the self-cleaning member with suitable pressing force and self-clean the cleaning tool.

(Mode 12) According to mode 12, there is proposed a substrate cleaning method. The substrate cleaning method includes a cleaning step of cleaning a substrate by rotating a cleaning tool and bringing the cleaning tool into contact with a surface of the substrate, and a self-cleaning step of self-cleaning the cleaning tool by rotating the cleaning tool and bringing the cleaning tool into contact with a self-cleaning member, and the self-cleaning step includes pressing the cleaning tool against the self-cleaning member with first pressing force when the cleaning tool is rotating at a first rotational speed and pressing the cleaning tool against the self-cleaning member with second pressing force larger than the first pressing force when the cleaning tool is rotating at a second rotational speed higher than the first rotational speed. According to mode 12, it is possible to press the cleaning tool against the self-cleaning member with suitable pressing force and self-clean the cleaning tool.

(Mode 13) According to mode 13, there is proposed a substrate cleaning method. The substrate cleaning method includes a cleaning step of cleaning a substrate by rotating a cleaning tool and bringing the cleaning tool into contact with a surface of the substrate, and a self-cleaning step of self-cleaning the cleaning tool by rotating the cleaning tool and bringing the cleaning tool into contact with an in-bath self-cleaning member in liquid or with supply of the liquid, and the self-cleaning step includes pressing the cleaning tool against the self-cleaning member with first pressing force when the liquid is at a first temperature and pressing the cleaning tool against the self-cleaning member with second pressing force larger than the first pressing force when the liquid is at a second temperature higher than the first temperature. According to mode 13, it is possible to press the cleaning tool against the self-cleaning member with suitable pressing force and self-clean the cleaning tool.

(Mode 14) According to mode 14, there is proposed a substrate cleaning method. The substrate cleaning method includes a cleaning step of cleaning a substrate by rotating a cleaning tool and bringing the cleaning tool into contact with a surface of the substrate, a selection step of selecting one of a first self-cleaning member which is formed of a first material and a second self-cleaning member which is formed of a second material, on the basis of external input, and a self-cleaning step of self-cleaning the cleaning tool by rotating the cleaning tool and bringing the cleaning tool into contact with the self-cleaning member selected in the selection step. According to mode 14, it is possible to select the self-cleaning member on the basis of the external input and self-clean the cleaning tool. This allows highly effective self-cleaning of the cleaning tool in a short time period.

(Mode 15) According to mode 15, there is proposed a substrate cleaning method. The substrate cleaning method includes a cleaning step of cleaning a substrate by rotating a cleaning tool and bringing the cleaning tool into contact with a surface of the substrate, a first self-cleaning step of self-cleaning the cleaning tool by rotating the cleaning tool and bringing the cleaning tool into contact with a first self-cleaning member which is formed of a first material, and a second self-cleaning step of, after the first self-cleaning step, self-cleaning the cleaning tool by rotating the cleaning tool and bringing the cleaning tool into contact with a second self-cleaning member which is formed of a second material. According to mode 15, self-cleaning of the cleaning tool is performed using the two self-cleaning members. This allows enhancement of a self-cleaning effect for the cleaning tool.

DESCRIPTION OF EMBODIMENTS

Figure 1:
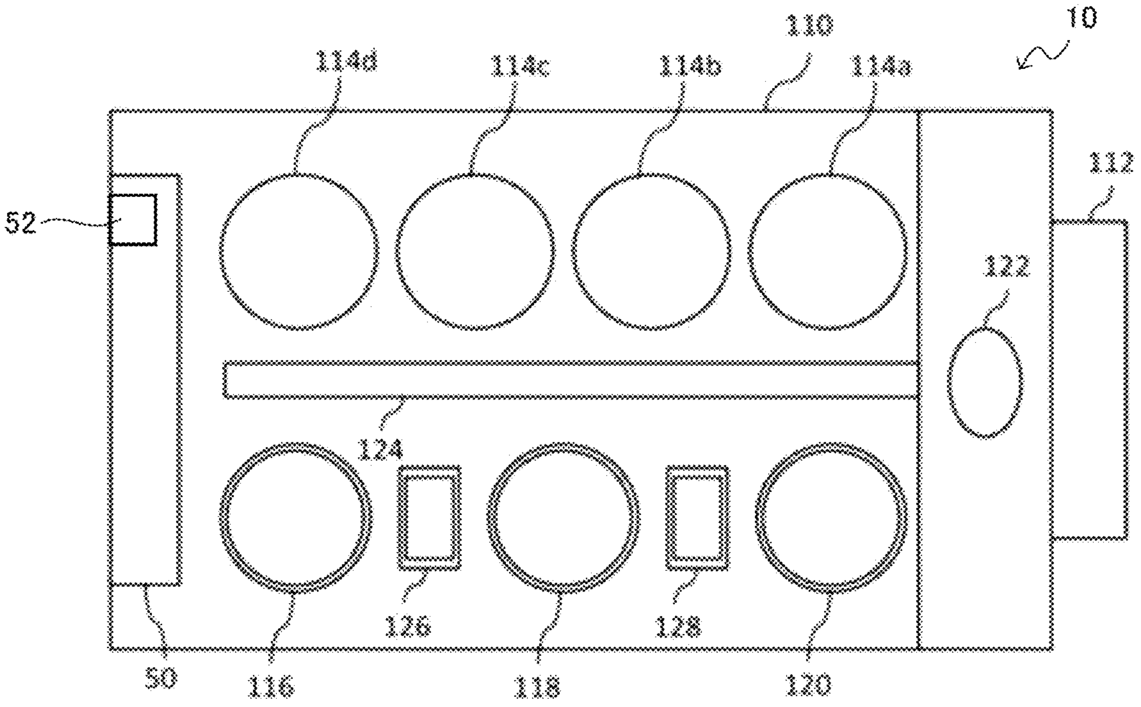
FIG. 1 is a plan view showing a schematic configuration of a substrate processing apparatus including a substrate cleaning apparatus according to an embodiment.

Embodiments of the present invention will be described below with reference to the drawings. In the drawings to be described below, the same or corresponding components are denoted by the same reference numerals, and a redundant description thereof will be omitted. Substrate cleaning apparatuses according to the embodiments of the present invention can each be used as a part of a substrate processing apparatus which processes a substrate, such as a semiconductor wafer.

First Embodiment

FIG. 1 is a view showing a schematic configuration of a substrate processing apparatus including a substrate cleaning apparatus according to an embodiment. As shown in FIG. 1, a substrate processing apparatus 10 has a housing 110 and a load port 112 which is arranged adjacent to the housing 110. An open cassette for stocking many substrates Wf (see, e.g., FIG. 2), a SMIF (Standard Manufacturing Interface) pod, or a FOUP (Front Opening Unified Pod) can be loaded onto the load port 112. A SMIF pod and a FOUP are each an airtight container which houses a substrate cassette inside and can maintain an environment independent of an external space.

A plurality of (four in the aspect shown in FIG. 1) polishing modules 114*a* to 114*d*, a first cleaning module 116 and a second cleaning module 118 which clean the substrate Wf after polishing, and a drying module 120 which dries the substrate Wf after cleaning are housed in the housing 110. In the example shown in FIG. 1, the polishing modules 114*a* to 114*d* are arrayed in a longitudinal direction of the substrate processing apparatus 10, and the cleaning modules 116 and 118 and the drying module 120 are arranged in parallel with the polishing modules 114*a* to 114*d*.

A first transfer robot 122 is arranged between the load port 112, and the polishing module 114*a* and the drying module 120 located closer to the load port 112. A transfer module 124 is arranged between the polishing modules 114*a* to 114*d*, and the cleaning modules 116 and 118 and the drying module 120. The first transfer robot 122 receives the substrate Wf before polishing from the load port 112 and passes the substrate Wf to the transfer module 124 or receives, from the transfer module 124, the substrate Wf after drying taken out from the drying module 120.

The polishing modules 114*a* to 114*d* are each a region where polishing (planarization) of the substrate Wf is performed. Since the polishing modules 114*a* to 114*d* are not central to the present invention, a detailed description thereof will be omitted.

A second transfer robot 126 which performs passing of the substrate Wf between the first cleaning module 116 and the second cleaning module 118 is arranged between the first cleaning module 116 and the second cleaning module 118. A third transfer module 128 which performs passing of the substrate Wf between the second cleaning module 118 and the drying module 120 is arranged between the second cleaning module 118 and the drying module 120. Additionally, a controller 50 which controls the movement of the modules of the substrate processing apparatus 10 is arranged inside the housing 110. In the present embodiment, the controller 50 is arranged inside the housing 110. Note that the present invention is not limited to this example and that the controller 50 may be arranged outside the housing 110. In the present embodiment, the controller 50 has an input module 52 which accepts external input. The external input here can include a user's mechanical operation and wired or wireless signal input from an external device.

The cleaning modules 116 and 118 according to the present embodiment each clean the substrate Wf by bringing a cleaning tool (to be described later) into contact with the surface of the substrate Wf while causing the cleaning tool to rotate. As each of the cleaning modules 116 and 118, a two-fluid jet cleaning device which cleans the surface of the substrate Wf with a two-fluid jet may be used in combination with the cleaning tool.

By way of example, the drying module 120 dries the substrate Wf by jetting IPA steam from a nozzle (not shown) toward the rotating substrate Wf. Alternatively, the drying module 120 may rotate the substrate Wf at high speed and dry the substrate Wf by centrifugal force.

Figure 2:
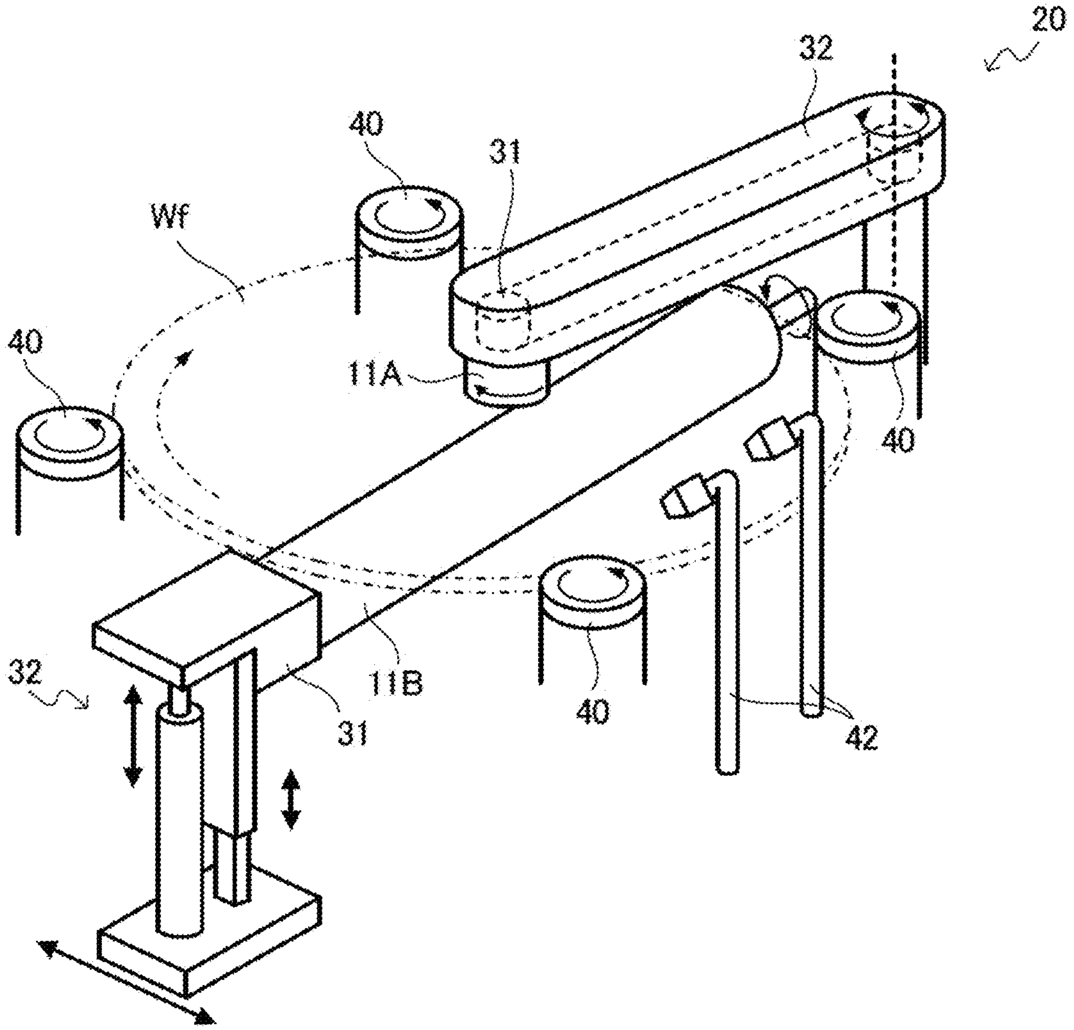
FIG. 2 is a perspective view showing a schematic configuration of the substrate cleaning apparatus according to the embodiment.
Figure 3:
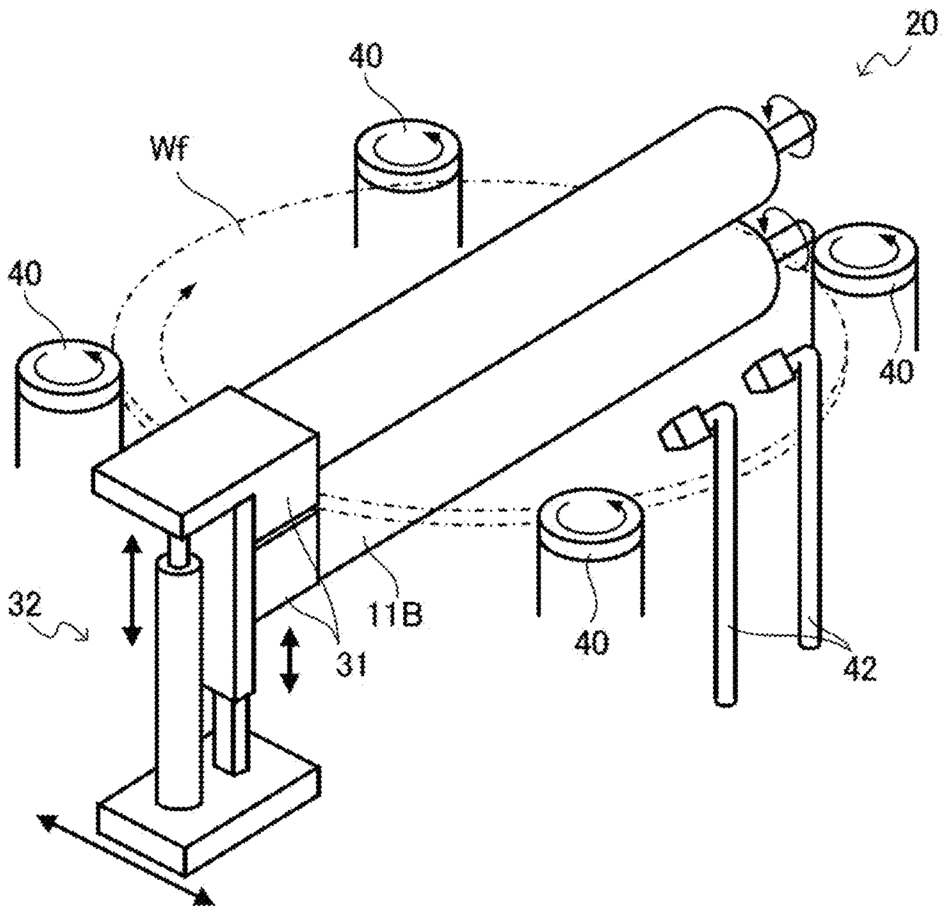
FIG. 3 is a perspective view showing a schematic configuration of a substrate cleaning apparatus according to another example.

FIG. 2 is a perspective view showing a schematic configuration of a substrate cleaning apparatus according to the embodiment, and FIG. 3 is a perspective view showing a schematic configuration of a substrate cleaning apparatus according to another example. As shown in FIGS. 2 and 3, a substrate cleaning apparatus 20 (the cleaning module 116 or 118) has a substrate rotation mechanism (see support members 40 (to be described later) in the present embodiment) which hold and rotate the substrate Wf and supply modules 42 which supply a cleaning liquid to the substrate Wf. Cleaning liquids according to the present embodiment include a rinse solution, such as ultrapure water (DIW), and a chemical solution, such as an aqueous solution of ammonia and hydrogen peroxide (SC-1), an aqueous solution of hydrochloric acid and hydrogen peroxide (SC-2), an aqueous solution of sulfuric acid and hydrogen peroxide (SPM), or hydrofluoric acid. Unless otherwise noted in the present embodiment, a cleaning liquid refers to either a rinse solution or a chemical solution.

The substrate Wf rotates on its central axis (an axis passing through a center O and perpendicular to the surface of the substrate Wf) as a rotation axis. Although the present embodiment will be described mainly using an aspect in which the surface of the substrate Wf extends along a horizontal direction and the rotation axis extends in a vertical direction, the present invention is not limited to this. The substrate rotation mechanism according to the present embodiment has four support members 40 which support an outer perimeter of the substrate Wf. The support member 40 is, for example, a spindle, a chuck, or the like. Rotation of the spindle, chuck, or the like allows rotation of the substrate Wf.

The substrate cleaning apparatus 20 includes a cleaning tool 11 which cleans the substrate Wf while in contact with the substrate Wf, a rotation mechanism 31 which rotates the cleaning tool 11, and a holding mechanism 32 which holds the cleaning tool 11. A pen member 11A (see FIG. 2) which rotates about a rotation axis generally perpendicular to the surface of the substrate Wf can be used as the cleaning tool 11. Alternatively, a roll member 11B (see FIGS. 2 and 3) which extends linearly over almost the entire length of a diameter of the substrate Wf can be used as the cleaning tool 11.

The rotation mechanism 31 rotates the cleaning tool 11 about a rotation axis generally perpendicular to the surface of the substrate Wf when the pen member 11A is used as the cleaning tool 11. The rotation mechanism 31 rotates the cleaning tool 11 about a rotation axis parallel to the surface of the substrate Wf when the roll member 11B is used as the cleaning tool 11. Various types of mechanisms can be adopted as the rotation mechanism 31. By way of example, a DC motor and a link mechanism can be adopted.

The holding mechanism 32 can move the cleaning tool 11 and the rotation mechanism 31 perpendicularly to the surface of the substrate Wf and press the cleaning tool 11 against the substrate Wf or move the cleaning tool 11 away from the substrate Wf. Various types of mechanisms can be adopted as the holding mechanism 32. By way of example, a motor drive mechanism using a ball screw, an air cylinder, or the like can be adopted. Alternatively, the holding mechanism 32 can move the cleaning tool 11 and the rotation mechanism 31 parallel to the surface of the substrate Wf and change a portion of contact between the cleaning tool 11 and the substrate Wf or move the cleaning tool 11 to a standby position (not shown).

Note that, in the example shown in FIG. 2, the pen member 11A cleans an upper surface (an upper surface in FIG. 2) of the substrate Wf and that the roll member 11B cleans a lower surface (a lower surface in FIG. 2) of the substrate Wf. In the example shown in FIG. 3, the roll member 11B cleans the obverse and the reverse of the substrate Wf. Note that the substrate Wf only needs to be cleaned by the cleaning tool 11 in contact with the surface of the substrate Wf and that the substrate cleaning apparatus 20 is not limited to the example in FIG. 2 or 3.

In a case where a new cleaning tool 11 is used (e.g., the cleaning tool 11 is replaced with another), a break-in of the cleaning tool 11 is performed. Since the cleaning tool 11 may be dry in its initial state, the cleaning tool 11 may damage the substrate Wf when the cleaning tool 11 in this state is used for cleaning processing. Even when the cleaning tool 11 is provided in a wet state, particles which are a source of contamination may be adherent to a sponge itself. For this reason, the cleaning tool 11 is saturated with water and is kneaded or an initial warm-up (break-in) is performed to remove the particles. Cleaning processing is executed using the cleaning tool 11 having undergone the break-in, and the substrate Wf is checked for back contamination after cleaning. Back contamination means that the clean substrate Wf is contaminated by the cleaning tool 11. Since occurrence of back contamination has a significant adverse effect on subsequent processes, a checkup for back contamination is important.

As cleaning of the substrate Wf with the cleaning tool 11 proceeds, processing debris at the time of polishing of the substrate Wf is accumulated on the surface of and in the cleaning tool 11. For this reason, self-cleaning of the cleaning tool 11 is periodically performed. The self-cleaning is performed by bringing the cleaning tool 11 into contact with a self-cleaning member 60. The self-cleaning of the cleaning tool 11 is performed between substrates (each time one substrate is cleaned) in a relatively short time period (a first time period) and performed between lots (each time a prescribed number of substrates are cleaned) in a relatively long time period (a second time period). In the present embodiment, in substrate-to-substrate self-cleaning, pure water (DIW) or the like is used as a liquid to be used for self-cleaning. In contrast, in lot-to-lot self-cleaning, ultrapure water is used after a chemical solution, such as an aqueous solution of ammonia and hydrogen peroxide (SC-1), an aqueous solution of hydrochloric acid and hydrogen peroxide (SC-2), an aqueous solution of sulfuric acid and hydrogen peroxide (SPM), or hydrofluoric acid, is used. Note that the present invention is not limited to this example, a chemical solution may be used in substrate-to-substrate self-cleaning, and that a chemical solution may not be used in lot-to-lot self-cleaning. Note that self-cleaning is assumed to include a break-in in the following description.

Figure 4:
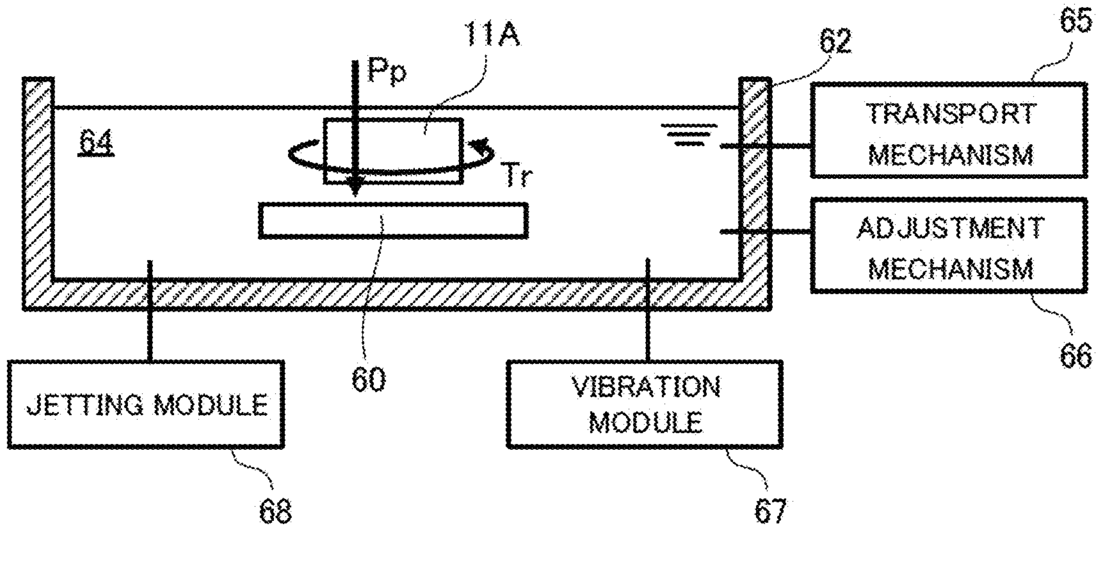
FIG. 4 is a view schematically showing self-cleaning of a pen member.
Figure 5:
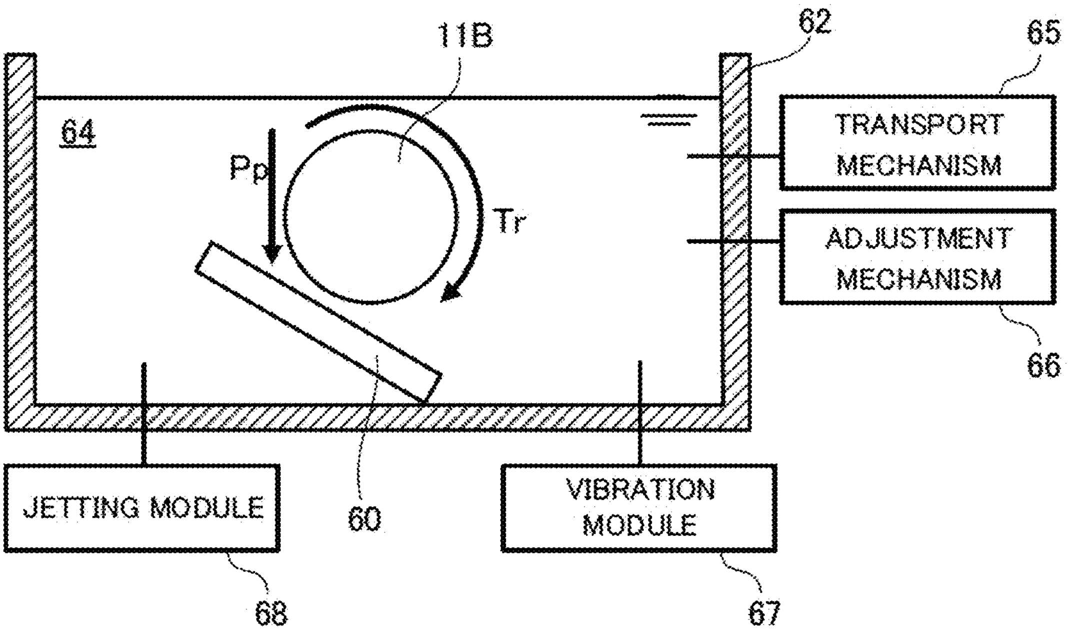
FIG. 5 is a view schematically showing self-cleaning of a roll member.

FIG. 4 is a view schematically showing self-cleaning of the pen member 11A, and FIG. 5 is a view schematically showing self-cleaning of the roll member 11B. As shown in FIGS. 4 and 5, the self-cleaning member 60 is arranged in a bath 62. The self-cleaning member 60 is formed of, for example, an inorganic oxide-based material, such as a quartz plate or a sapphire plate, or a good organic polymer-based material with chemical resistance and low elution, such as PTFE, PVDF, PFA, PPS, PEEK, or PMMA. A liquid 64, such as ultrapure water (DIW) or a chemical solution (e.g., an aqueous solution of ammonia and hydrogen peroxide (SC-1), an aqueous solution of hydrochloric acid and hydrogen peroxide (SC-2), an aqueous solution of sulfuric acid and hydrogen peroxide (SPM), or hydrofluoric acid), is stored in the bath 62. In the bath 62, it is preferable that a transport mechanism 65 supply a clean liquid or circulate an internal liquid while cleaning the internal liquid. The liquid 64 stored in the bath 62 is preferably adjusted in temperature by an adjustment mechanism 66. For example, a heater can be used as the adjustment mechanism 66. Additionally, the substrate cleaning apparatus 20 may include a vibration module 67 which gives ultrasound vibration into the bath 62 at the time of self-cleaning of the cleaning tool 11. Alternatively, the substrate cleaning apparatus 20 may include a jetting module 68 which jets gas or liquid toward the cleaning tool 11 at the time of self-cleaning of the cleaning tool 11.

Note that the self-cleaning member 60 is arranged in the bath 62 in the examples shown in FIGS. 4 and 5. The present invention, however, is not limited to these examples, and the bath 62 may not be provided. Note that, even when the bath 62 is not provided, self-cleaning of the cleaning tool 11 may be performed with supply of the liquid 64 by the transport mechanism 65, i.e., while the liquid 64 is, for example, continuously run over the cleaning tool 11. Even in this case, a temperature of the liquid 64 may be adjusted by the adjustment mechanism 66.

As shown in FIG. 4, when the pen member 11A is self-cleaned, the rotation mechanism 31 rotates the pen member 11A, and the holding mechanism 32 presses the pen member 11A against the self-cleaning member 60. Note that although FIG. 4 shows an example where a surface of the self-cleaning member 60 is perpendicular to the rotation axis of the pen member 11A, the present invention is not limited to this example. As shown in FIG. 5, when the roll member 11B is self-cleaned, the rotation mechanism 31 rotates the roll member 11B, and the holding mechanism 32 presses the roll member 11B against the self-cleaning member 60. Note that although, in the example shown in FIG. 5, the surface of the self-cleaning member 60 is inclined to the vertical direction, and the roll member 11B moves in the vertical direction to come into contact with the self-cleaning member 60, the present invention is not limited to this example.

Figure 6:
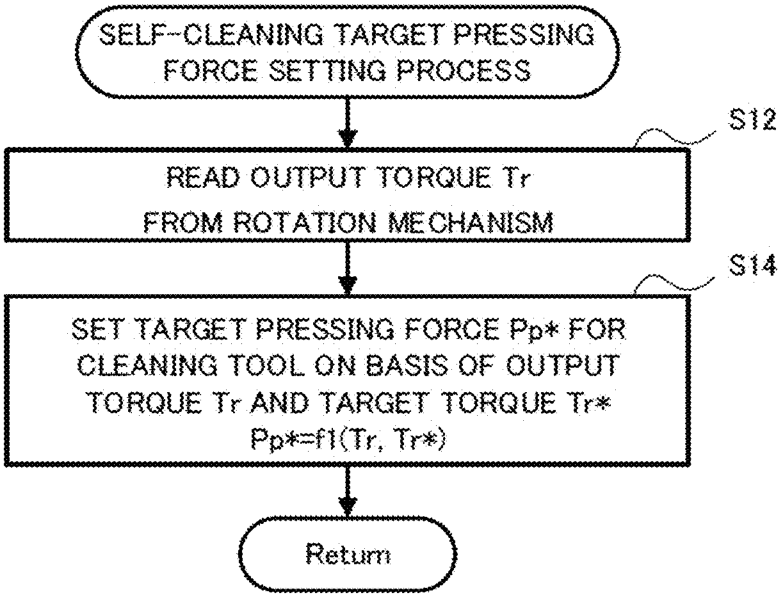
FIG. 6 is a flowchart showing an example of a self-cleaning target pressing force setting process to be executed by a controller according to a first embodiment.

FIG. 6 is a flowchart showing an example of a self-cleaning target pressing force setting process to be executed by the controller 50 according to the embodiment. This process is executed at prescribed time intervals (e.g., every several tens of msec) when the cleaning tool 11 is brought into contact with the self-cleaning member 60, i.e., when the cleaning tool 11 is self-cleaned.

When the above-described process is started, the controller 50 first reads output torque Tr from the rotation mechanism 31 (S12). The output torque Tr is torque, with which the rotation mechanism 31 rotates the cleaning tool 11, when the cleaning tool 11 and the self-cleaning member 60 are in contact and can be detected on the basis of, for example, a value of current which flows to a motor (not shown) of the rotation mechanism 31. As for the output torque Tr, a torque command from the controller 50 to the rotation mechanism 31 may be used.

The controller 50 then sets target pressing force Pp*, with which the cleaning tool 11 is to be pressed against the self-cleaning member 60, on the basis of the output torque Tr and prescribed target torque Tr* (S14) and ends the present process. The target torque Tr* here is prescribed torque determined in advance and is torque equal to or more than torque (substrate cleaning torque) which acts on the cleaning tool 11 when the cleaning tool 11 cleans the substrate Wf. The target torque Tr* may be set by external input. By way of example, the setting of the target pressing force Pp* can be performed on the basis of a difference between the output torque Tr and the target torque Tr* by a PI operation using a proportional gain Gp and an integral gain Gi or a PID operation using the proportional gain Gp, the integral gain Gi, and a derivative gain Gd. When the controller 50 ends the present process, the controller 50 controls the holding mechanism 32 such that the cleaning tool 11 is pressed against the self-cleaning member 60 with the target pressing force Pp*.

Friction between the cleaning tool 11 and the self-cleaning member 60 varies with not only pressing force Pp for the cleaning tool 11 against the self-cleaning member 60 but also conditions, such as abrasion of the cleaning tool 11, a rotational speed (a number Ns of revolutions) of the cleaning tool 11, a type and a temperature Tc of the liquid 64, and a material for and a shape of the self-cleaning member 60. When the friction between the cleaning tool 11 and the self-cleaning member 60 is insufficient, a full self-cleaning effect may not be achieved in self-cleaning of the cleaning tool 11. In this case, the insufficient self-cleaning of the cleaning tool 11 may cause back contamination of the substrate Wf to adversely affect subsequent processes or increase a time period and a cost required for a break-in checkup. On the other hand, when the friction between the cleaning tool 11 and the self-cleaning member 60 is excessively large, abrasion may cause deterioration of the cleaning tool 11. In contrast, in the substrate cleaning apparatus 20 according to the present embodiment, pressing force for the cleaning tool 11 against the self-cleaning member 60 is controlled such that the output torque Tr from the rotation mechanism 31 when the cleaning tool 11 and the self-cleaning member 60 are in contact is the prescribed torque equal to or more than the substrate cleaning torque. Adoption of torque which prevents deterioration of the cleaning tool 11 as the prescribed torque makes it possible to press the cleaning tool 11 against the self-cleaning member 60 with suitable pressing force and self-clean the cleaning tool 11.

In the substrate cleaning apparatus 20 according to the present embodiment, the target torque Tr* is set at torque equal to or more than the substrate cleaning torque. That is, the target torque Tr* is torque equal to or more than torque which acts on the cleaning tool 11 when processing debris is accumulated at the cleaning tool 11. Use of the target torque Tr* makes it possible to suitably remove processing debris from the cleaning tool 11 in a short time period.

Second Embodiment

Figure 7:
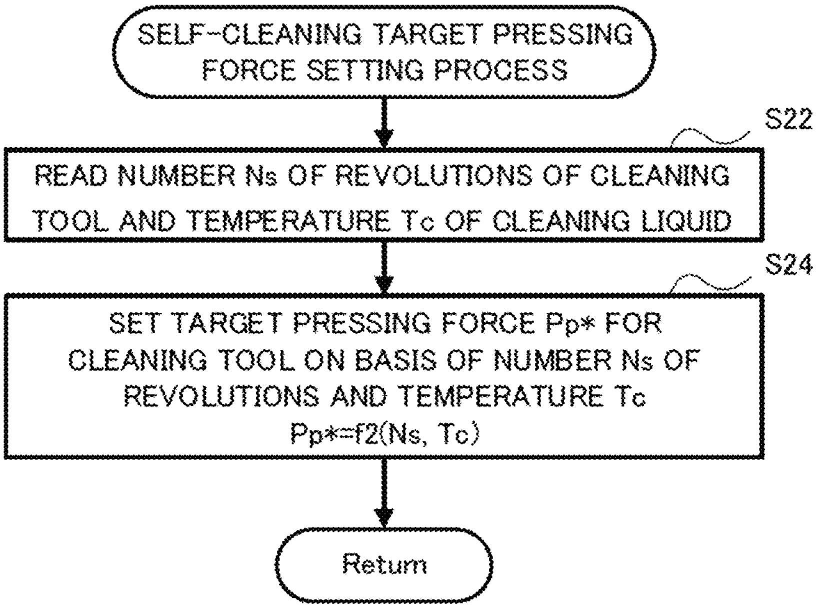
FIG. 7 is a flowchart showing an example of a self-cleaning target pressing force setting process to be executed by a controller according to a second embodiment.

A substrate processing apparatus 10 according to a second embodiment has the same configuration as the substrate processing apparatus 10 according to the first embodiment, and a redundant description thereof will be omitted. The substrate processing apparatus 10 according to the second embodiment is different from the substrate processing apparatus 10 according to the first embodiment in that a self-cleaning target pressing force setting process shown in FIG. 7 is executed instead of the process shown in FIG. 6. The process shown in FIG. 7 is executed at prescribed time intervals (e.g., every several tens of msec) by a controller 50 when a cleaning tool 11 is brought into contact with a self-cleaning member 60, i.e., when the cleaning tool 11 is self-cleaned.

When the above-described process is started, a controller 50 reads a number Ns of revolutions of the cleaning tool 11 and a temperature Tc of a liquid 64 (S22). As the number Ns of revolutions of the cleaning tool 11, a detected value from a sensor (not shown) which detects the number Ns of revolutions of the cleaning tool 11 or a detected value from a sensor (not shown) which detects the number of revolutions of a rotation mechanism 31 can be used. As for the number Ns of revolutions of the cleaning tool 11, a number-of-revolutions command to the rotation mechanism 31 may be used. As the temperature Tc of the liquid 64, a detected value from a temperature sensor (not shown) which is provided at a bath 62 can be used. As for the temperature Tc of the liquid 64, a temperature command from an adjustment mechanism 66 may be used.

Figure 8:
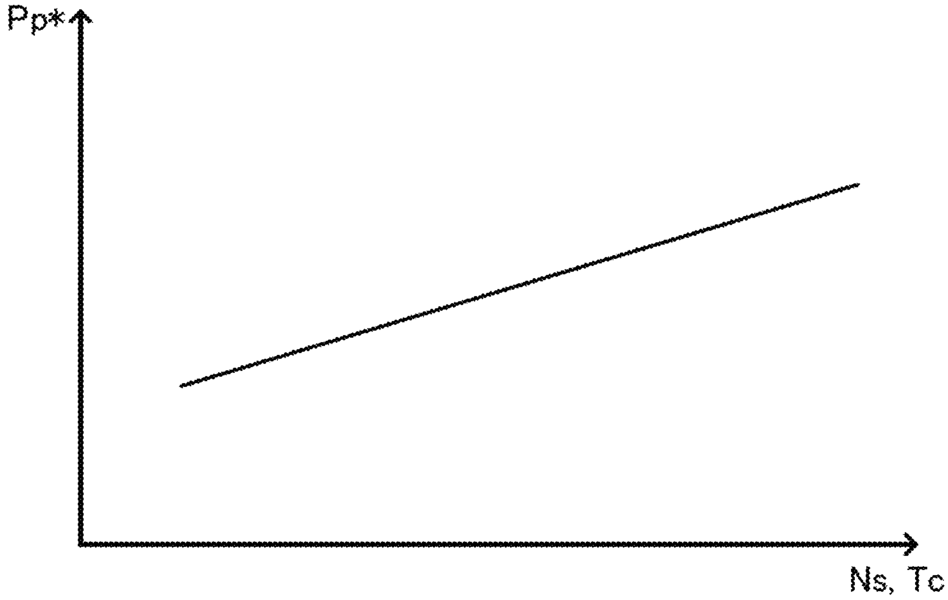
FIG. 8 is a graph showing an example of a relationship between a number Ns of revolutions and a temperature Tc, and target pressing force Pp*.

The controller 50 then sets target pressing force Pp*, with which the cleaning tool 11 is to be pressed against the self-cleaning member 60, on the basis of the number Ns of revolutions and the temperature Tc (S24) and ends the present process. In the process in S24, the target pressing force Pp* is set such that the target pressing force Pp* tends to increase with increase in the number Ns of revolutions and tends to increase with increase in the temperature Tc of the liquid 64. FIG. 8 is a graph showing an example of a relationship between the number Ns of revolutions and the temperature Tc, and the target pressing force Pp*. Note that although FIG. 8 shows an example where the target pressing force Pp* increases linearly with increase in the number Ns of revolutions or the temperature Tc, the present invention is not limited to this example. For example, the target pressing force Pp* may increase in a stepwise manner with increase in the number Ns of revolutions or the temperature Tc or the relationship between the number Ns of revolutions and the temperature Tc, and the target pressing force Pp* may be curvilinearly indicated. By way of example, the relationship between the number Ns of revolutions and the temperature Tc, and the target pressing force Pp* can be defined in advance as a map through, e.g., an experiment, and the process in S24 can be performed on the basis of the map and the number Ns of revolutions and the temperature Tc that are read. Note that the present invention is not limited to this example and that the controller 50 may set the target pressing force Pp* on the basis of the number Ns of revolutions and the temperature Tc by various types of methods. When the controller 50 ends the present process, the controller 50 controls a holding mechanism 32 such that the cleaning tool 11 is pressed against the self-cleaning member 60 with the target pressing force Pp*.

The studies by the present inventor have discovered that friction between the cleaning tool 11 and the self-cleaning member 60 tends to decrease with increase in the number Ns of revolutions of the cleaning tool 11. For this reason, in a substrate cleaning apparatus 20 according to the second embodiment, the cleaning tool 11 is pressed against the self-cleaning member 60 with first pressing force Pp1 when the cleaning tool 11 is rotating at a first rotational speed Ns1. The cleaning tool 11 is pressed against the self-cleaning member 60 with second pressing force Pp2 (Pp2>Pp1) larger than the first pressing force Pp1 when the cleaning tool 11 is rotating at a second rotational speed Ns2 (Ns2>Ns1) higher than the first rotational speed Ns1. This allows inhibition of a situation where a full effect cannot be obtained due to insufficient friction between the cleaning tool 11 and the self-cleaning member 60 when the number Ns of revolutions of the cleaning tool 11 is large. That is, the substrate cleaning apparatus 20 according to the second embodiment can press the cleaning tool 11 against the self-cleaning member 60 with suitable pressing force and self-clean the cleaning tool 11.

The studies by the present inventor have discovered that friction between the cleaning tool 11 and the self-cleaning member 60 tends to decrease with increase in the temperature Tc of the liquid 64. For this reason, in the substrate cleaning apparatus 20 according to the second embodiment, the cleaning tool 11 is pressed against the self-cleaning member 60 with the first pressing force Pp1 when the temperature Tc of the liquid 64 is a first temperature Tc1. The cleaning tool 11 is pressed against the self-cleaning member 60 with the second pressing force Pp2 (Pp2>Pp1) larger than the first pressing force Pp1 when the temperature Tc of the liquid 64 is a second temperature Tc2 (Tc2>Tc1) higher than the first temperature Tc1. This allows inhibition of a situation where a full effect cannot be obtained due to insufficient friction between the cleaning tool 11 and the self-cleaning member 60 when the temperature Tc of the liquid 64 is high. That is, the substrate cleaning apparatus 20 according to the second embodiment can press the cleaning tool 11 against the self-cleaning member 60 with suitable pressing force and self-clean the cleaning tool 11.

Note that although the target pressing force Pp* is set on the basis of the number Ns of revolutions of the cleaning tool 11 and the temperature Tc of the liquid 64 in the substrate cleaning apparatus 20 according to the second embodiment, the target pressing force Pp* may be set on the basis of one of the number Ns of revolutions and the temperature Tc. The target pressing force Pp* may be set on the basis of another parameter instead of or in addition to these parameters. By way of example, the target pressing force Pp* may be set so as to increase with increase in the number of times the substrate Wf is cleaned by the cleaning tool 11. Alternatively, the target pressing force Pp* may be set at a value larger when a chemical solution containing a surfactant is used as the liquid 64 than when ultrapure water is used as the liquid 64. Alternatively, the target pressing force Pp* may be set on the basis of a material for the self-cleaning member 60. Alternatively, the target pressing force Pp* may be set so as to increase or decrease with increase in a time period of contact between the cleaning tool 11 and the self-cleaning member 60.

Third Embodiment

A substrate cleaning apparatus 20 according to a third embodiment is different from the substrate cleaning apparatus 20 according to the first embodiment in that the substrate cleaning apparatus 20 has, as a self-cleaning member 60, a first member (a first self-cleaning member) 60A which is formed of a first material and a second member (a second self-cleaning member) 60B which is formed of a second material, and the other components are the same as those of the substrate cleaning apparatus 20 according to the first embodiment. The first material here is, for example, an inorganic oxide-based material or an organic polymer-based material (a first organic polymer-based material) in which surface free energy has a relatively large hydrogen-bonding component due to the presence of a polar group in a molecular structure. The second material is, for example, an organic polymer-based material (a second organic polymer-based material) in which surface free energy has a relatively large dispersion force component due to the absence of a polar group in a molecular structure.

Figure 9:
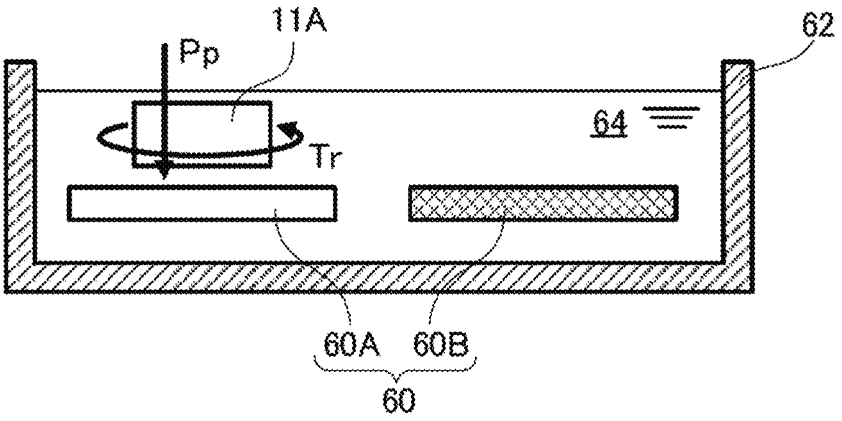
FIG. 9 is a view showing an example of a combination of a bath and a self-cleaning member according to a third embodiment.

FIG. 9 is a view showing an example of a combination of a bath and a self-cleaning member according to the third embodiment. As shown in FIG. 9, in the third embodiment, the first member 60A and the second member 60B are arranged in a bath 62. Note that the present invention is not limited to this example, the first member 60A and the second member 60B may be arranged in separate baths 62. Alternatively, the bath 62 may not be provided. Note that, even when the bath 62 is not provided, self-cleaning of a cleaning tool 11 may be performed with supply of a liquid 64 by a transport mechanism 65, i.e., while the liquid 64 is, for example, continuously run over the cleaning tool 11.

Figure 10:
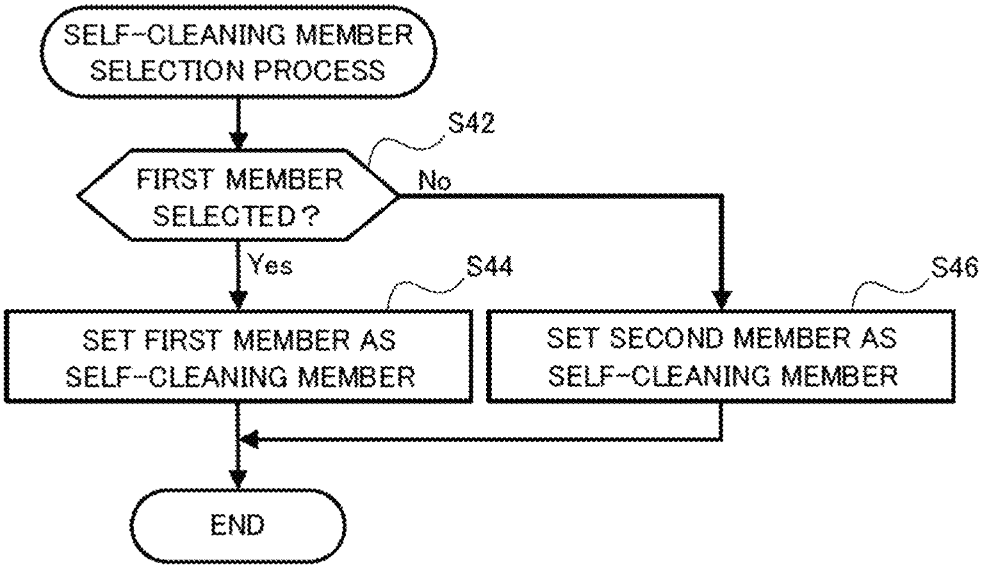
FIG. 10 is a flowchart showing an example of a self-cleaning member selection process to be executed by a controller according to the third embodiment.

FIG. 10 is a flowchart showing an example of a self-cleaning member selection process to be executed by a controller 50 according to the third embodiment. By way of example, the process is executed upon activation of the substrate cleaning apparatus 20 or at a time when an input module 52 receives external input. When the present process is executed, the controller 50 judges on the basis of the external input whether the first member 60A is selected (S42). By way of example, this process can be performed by referring to a prescribed region of a memory (not shown) of the controller 50. When the first member 60A is selected (YES in S42), the controller 50 sets the first member 60A as a self-cleaning member and ends the present process. On the other hand, when the first member 60A is not selected (NO in S42), the controller 50 sets the second member 60B as the self-cleaning member and ends the present process. The controller 50 executes self-cleaning of the cleaning tool 11 using the self-cleaning member 60 selected by the present process.

Suitable materials for the self-cleaning member 60 that self-cleans the cleaning tool 11 are assumed to differ depending on processing debris accumulated at the cleaning tool 11. For example, when the self-cleaning member 60 is intended for processing debris, such as abrasive grains, in which surface free energy has a larger hydrogen-bonding component, it is considered preferable to use, as the self-cleaning member 60, the first member 60A that is formed of an inorganic oxide-based material or an organic polymer-based material having a polar group in a molecular structure. When the self-cleaning member 60 is intended for processing debris, such as organic complexes, in which surface free energy has a larger dispersion force component, it is considered preferable to use, as the self-cleaning member 60, the second member 60B that is formed of an organic polymer-based material having no polar group in a molecular structure. To this end, the substrate cleaning apparatus 20 according to the third embodiment selects the self-cleaning member 60 on the basis of external input, and self-cleaning of the cleaning tool 11 can be executed by the suitable self-cleaning member 60. This makes it possible to perform highly effective self-cleaning of a cleaning tool in a short time period.

Note that there is also available an inorganic oxide-based material, such as quartz, in which a hydrogen-bonding component of surface free energy as described above decreases significantly with increase in temperature. For this reason, when warming of the liquid 64 is used in combination, a material, such as PMMA, which is an organic polymer-based material and has a relatively large hydrogen-bonding component even at high temperatures due to the presence of a polar group in a molecular structure may be used for a cleaning tool which is intended for processing debris having a larger hydrogen-bonding component. In other words, the first member 60A may be formed of a material in which surface free energy has a larger hydrogen-bonding component and a smaller dispersion force component than the second member 60B at the time of self-cleaning of the cleaning tool 11.

Fourth Embodiment

A substrate cleaning apparatus 20 according to a fourth embodiment has the same configuration as the substrate cleaning apparatus 20 according to the third embodiment. The substrate cleaning apparatus 20 according to the fourth embodiment is different from the substrate cleaning apparatus 20 according to the third embodiment in that a cleaning tool 11 is brought into contact with both a first member 60A and a second member 60B.

Figure 11:
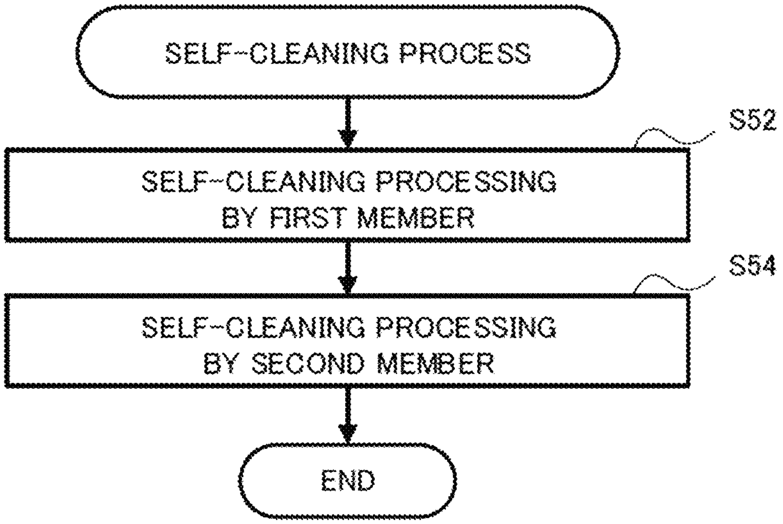
FIG. 11 is a flowchart showing an example of a self-cleaning process to be executed by a controller according to a fourth embodiment.

FIG. 11 is a flowchart showing an example of a self-cleaning process to be executed by a controller 50 according to the fourth embodiment. This process is executed when the cleaning tool 11 is self-cleaned. When the self-cleaning process is executed, the controller 50 first executes self-cleaning processing by the first member 60A by bringing the cleaning tool 11 into contact with the first member 60A while rotating the cleaning tool 11 (S52). The controller 50 then executes self-cleaning processing by the second member 60B by bringing the cleaning tool 11 into contact with the second member 60B while rotating the cleaning tool 11 (S54) and ends the present process.

According to the fourth embodiment, self-cleaning of the cleaning tool 11 is executed by bringing the cleaning tool 11 into contact with the first member 60A that is formed of an inorganic oxide-based material or an organic polymer-based material having a polar group in a molecular structure while rotating the cleaning tool 11 and then bringing the cleaning tool 11 into contact with the second member 60B that is formed of an organic polymer-based material having no polar group in a molecular structure while rotating the cleaning tool 11. This makes it possible to first remove processing debris, such as abrasive grains, in which surface free energy has a larger hydrogen-bonding component, from the cleaning tool 11 and then remove processing debris, such as organic complexes, in which surface free energy has a larger dispersion force component, from the cleaning tool 11. By this method, highly effective self-cleaning of a cleaning tool can be performed in a short time period.

Although the embodiments of the present invention have been described above, the above-described embodiments of the invention are intended for easy understanding of the present invention and are not intended to limit the present invention. It is apparent that the present invention can be changed and altered without departing from the spirit thereof and include its equivalents. The embodiments and modifications can be arbitrarily combined in a range where at least a part of the above-described problems can be solved or a range where at least a part of the effects can be produced. The components described in the claims and the specification can be arbitrarily combined or omitted.

The present application claims priority from Japanese Patent Application No. 2018-048217 filed on Mar. 15, 2018. All disclosures including the specifications, claims, drawings, and abstract of Japanese Patent Application No. 2018-048217 are incorporated herein by reference in its entirety. All disclosures including the specifications, claims, drawings, and abstract of Japanese Patent Laid-Open No. 2005-012238 (PTL 1) are incorporated herein by reference in its entirety.

REFERENCE SIGNS LIST

10 substrate processing apparatus
11 cleaning tool
11A pen member
11B roll member
20 substrate cleaning apparatus
31 rotation mechanism
32 holding mechanism
40 support member
42 supply module
50 controller
52 input module
60 self-cleaning member
60A first member (first self-cleaning member)
60B second member (second self-cleaning member)
62 bath
64 liquid
65 transport mechanism
66 adjustment mechanism
67 vibration module
68 jetting module

The invention claimed is:

1. A substrate cleaning apparatus comprising:
a cleaning tool for cleaning a rotating substrate while in contact with a surface of the rotating substrate;
a self-cleaning member for self-cleaning the cleaning tool while while the cleaning tool is in contact with the self-cleaning member and in contact with a liquid;
a rotation mechanism for rotating the cleaning tool;
a holding mechanism which holds the cleaning tool, the holding mechanism being capable of pressing the cleaning tool against the substrate and pressing the cleaning tool against the self-cleaning member, wherein the holding mechanism is configured to hold the cleaning tool while the cleaning tool is moved from the substrate and into contact with the self-cleaning member; and
a controller configured to control pressing of the cleaning tool first against the rotating substrate and subsequently against the self-cleaning member, wherein the controller is configured to receive a sensed temperature of the liquid, and wherein the controller is configured to control the holding mechanism such that the cleaning tool is pressed against the self-cleaning member with a first pressing force in response to the sensed temperature being a first temperature and to control the holding mechanism such that the cleaning tool is pressed against the self-cleaning member with a second pressing force in response to the sensed temperature being a second temperature, wherein the second pressing force is larger than the first pressing force, and wherein the second temperature is higher than the first temperature.

2. A substrate cleaning apparatus according to claim 1, wherein
the controller, when the cleaning tool is in contact with the self-cleaning member, reads a rotational speed of the cleaning tool and controls the holding mechanism such that a force with which the cleaning tool is pressed against the self-cleaning member is selected in response to said rotational speed.

3. The substrate cleaning apparatus according to claim 1, wherein
the self-cleaning of the cleaning tool comprises short-time self-cleaning of first duration and long-time self-cleaning of second duration, wherein the second duration is longer than the first duration, and
ultrapure water is used in the short-time self-cleaning, and an ultrapure water rinse is used after chemical solution processing in the long-time self-cleaning or only ultrapure water processing is performed in the long-time self-cleaning.

4. The substrate cleaning apparatus according to claim 1, further comprising:
a bath in which liquid is stored and which houses the self-cleaning member; and
a vibration module which gives ultrasound vibration to the liquid.

5. The substrate cleaning apparatus according to claim 1, further comprising
a jetting module which jets gas or liquid toward the cleaning tool during the self-cleaning of the cleaning tool.

6. A substrate cleaning method comprising:
a cleaning step of cleaning a rotating substrate by rotating a cleaning tool and brining the cleaning tool into contact with a surface of the rotating substrate, wherein a holding mechanism holds the cleaning tool during the cleaning step;

a moving step of moving the cleaning tool away from the substrate and into contact with a self-cleaning tool, wherein the holding mechanism holds the cleaning tool during the moving step;

a self-cleaning step of self-cleaning the cleaning tool by rotating the cleaning tool and contacting the cleaning tool with the self-cleaning member while the cleaning tool is in contact with a liquid; and a sensing step of sensing a temperature of the liquid during the self-cleaning step, wherein a controller controls pressing of the cleaning tool first against the rotating substrate and subsequently against the self-cleaning member, wherein the controller is configured to receive the sensed temperature of the liquid, and wherein the controller is configured to control the holding mechanism such that the cleaning tool is pressed against the self-cleaning member with a first pressing force in response to the sensed temperature being a first temperature and to control the holding mechanism such that the cleaning tool is pressed against the self-cleaning member with a second pressing force in response to the sensed temperature being a second temperature, wherein the second pressing force is larger than the first pressing force, and wherein the second temperature is higher than the first temperature.

7. A substrate cleaning method according to claim 6, further comprising:

a reading step of reading a rotational speed of the cleaning tool during the self-cleaning step, wherein the controller, during the self-cleaning step, controls the holding mechanism such that a force with which the cleaning tool is pressed against the self-cleaning member is selected in response to said rotational speed.

* * * * *